US006624717B2

(12) United States Patent
Dabral et al.

(10) Patent No.: US 6,624,717 B2
(45) Date of Patent: Sep. 23, 2003

(54) IMPEDANCE MATCHED BUS TRACES OVER DE-GASSING HOLES

(75) Inventors: Sanjay Dabral, Palo Alto, CA (US); Ming Zeng, San Jose, CA (US); Dillip Sampath, Sunnyvale, CA (US); Zale T. Schoenborn, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/935,512

(22) Filed: Aug. 22, 2001

(65) Prior Publication Data

US 2001/0052829 A1 Dec. 20, 2001

Related U.S. Application Data

(62) Division of application No. 09/474,345, filed on Dec. 29, 1999.

(51) Int. Cl.[7] .............................. H01P 3/08; H05K 7/02
(52) U.S. Cl. ........................ 333/33; 174/255; 361/748
(58) Field of Search .......................... 333/33; 174/255; 361/748, 794

(56) References Cited

U.S. PATENT DOCUMENTS 5,519,176 A * 5/1996 Goodman et al. .......... 174/255
6,303,871 B1 * 10/2001 Zu et al. ..................... 174/250

* cited by examiner

Primary Examiner—Robert Pascal
Assistant Examiner—Stephen E. Jones
(74) Attorney, Agent, or Firm—Seth Z. Kalson

(57) ABSTRACT

Various bus trace topologies are provided which allow for shorter stub lengths, reduced motherboard costs, more efficient routing between multiple agents, and bus traces with better matched characteristic impedances.

5 Claims, 7 Drawing Sheets

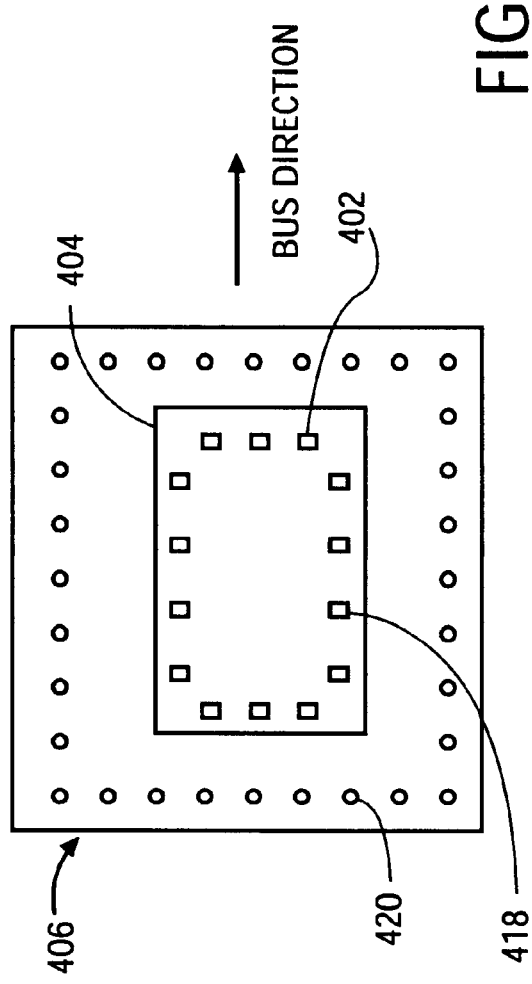
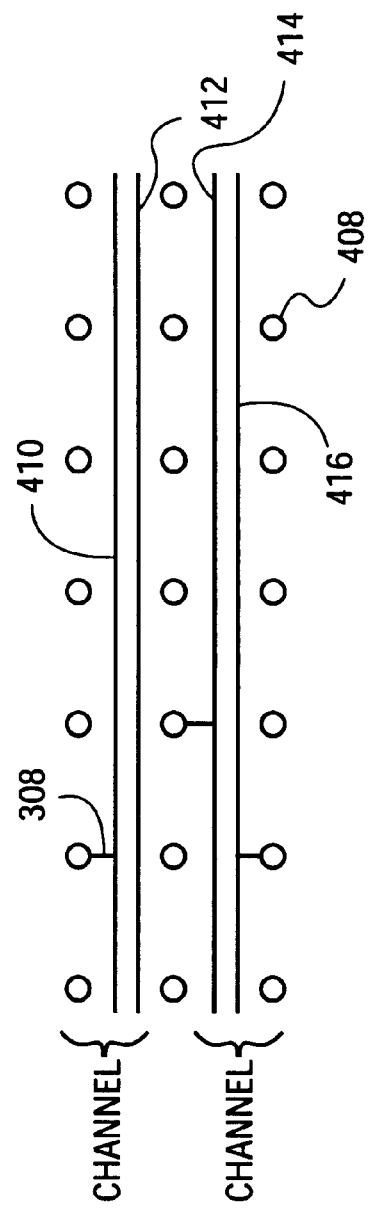
FIG. 4A
FIG. 4B

IMPEDANCE MATCHED BUS TRACES OVER DE-GASSING HOLES

This application is a divisional of U.S. patent application Ser. No. 09/474,345 filed on Dec. 29, 1999.

FIELD

The present invention is directed to circuit boards, and more particularly, bus topologies for circuit boards.

BACKGROUND

With increasing processor clock rates in the personal computer, workstation, and server industry, there is a pressing need to provide high speed, economical bus topologies. In particular, designing for high speed and economical communication among more than one processor or agent connected to a bus presents various challenges.

Over the years, many bus topologies have been designed. For example, FIG. 1 illustrates a "3D" topology (e.g., vertical cards on a motherboard give the interconnect a 3D nature) in which processor modules 102, along with their associated heat sinks 104, are mounted on processor cards 106, which are connected together to chip set 108 via bus 109 on motherboard 110. (In an actual embodiment, bus 109 and other traces indicated in FIG. 1 may not be visible.) The connections between an agent, such as a microprocessor, and a bus are often referred to as stubs, and are indicated by numeral 112 in FIG. 1. For some applications, the stub lengths for the 3D topology of FIG. 1 are too long, resulting in undesirable signal reflections.

Yet another bus topology is illustrated in FIG. 2, sometimes called a "2.5D" topology (because there is less vertical dimension when compared to the 3D topology of FIG. 1). For this topology, components (processors or agents) 202, along with their associated heat sinks 204, are mounted on both sides of motherboard 206, facing each other, using connectors 210, and are connected to chip set 208 via bus 209. A stub is identified by numeral 212, but not all stubs are shown. Such topologies are relatively expensive due to motherboard assembly costs. Also, for the topology of FIG. 2, some of the stubs may be too close to each other, so that signal reflections pose a more serious problem.

Busses with many traces may also present design challenges. Some prior art bus topologies use many layers in the motherboard to route the bus traces to chip packages. However, this adds to motherboard complexity and cost. Alternatively, some prior art bus topologies route the bus traces on only one layer or a few layers of the motherboard. But because the dimension of the chip package is often smaller than the physical width occupied by the bus traces when deposited on one layer, some of the stubs may be too long for some applications.

Embodiments of the present invention are directed to addressing these problems.

BRIEF DESCRIPTION OF THE DRAWINGS

FIGS. 4a and 4b provide two plan views illustrating an embodiment of the present invention having an inline topology.

DETAILED DESCRIPTION OF THE EMBODIMENTS

Figure 1:
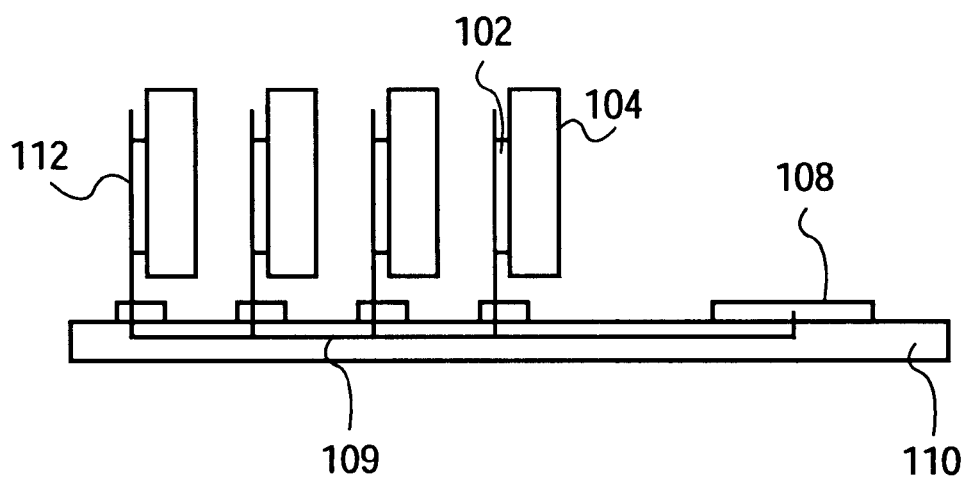
FIG. 1 illustrates a prior art bus topology.
Figure 2:
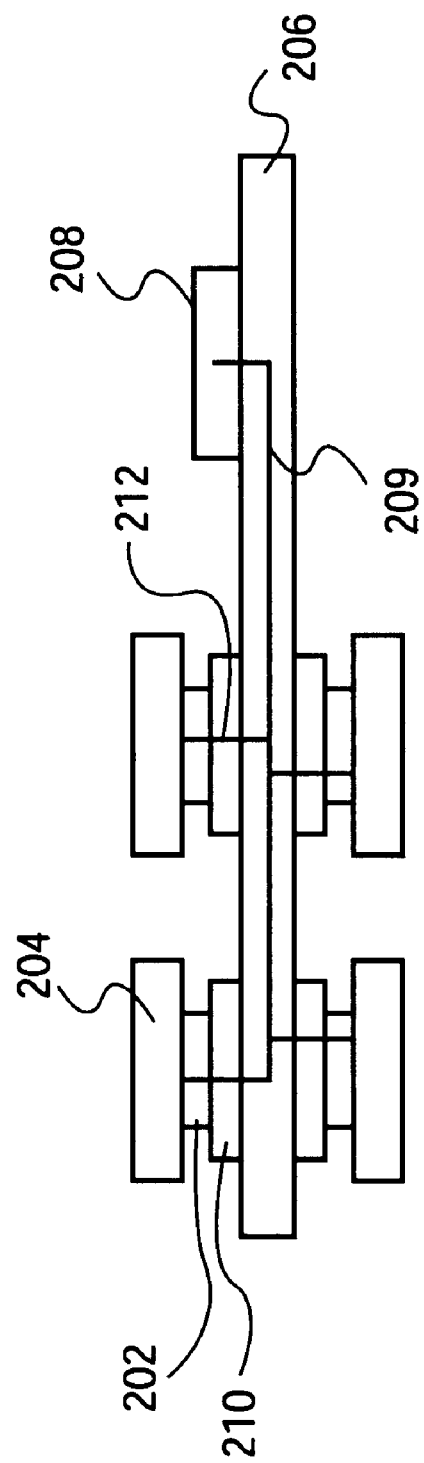
FIG. 2 illustrates another prior art bus topology.
Figure 3:
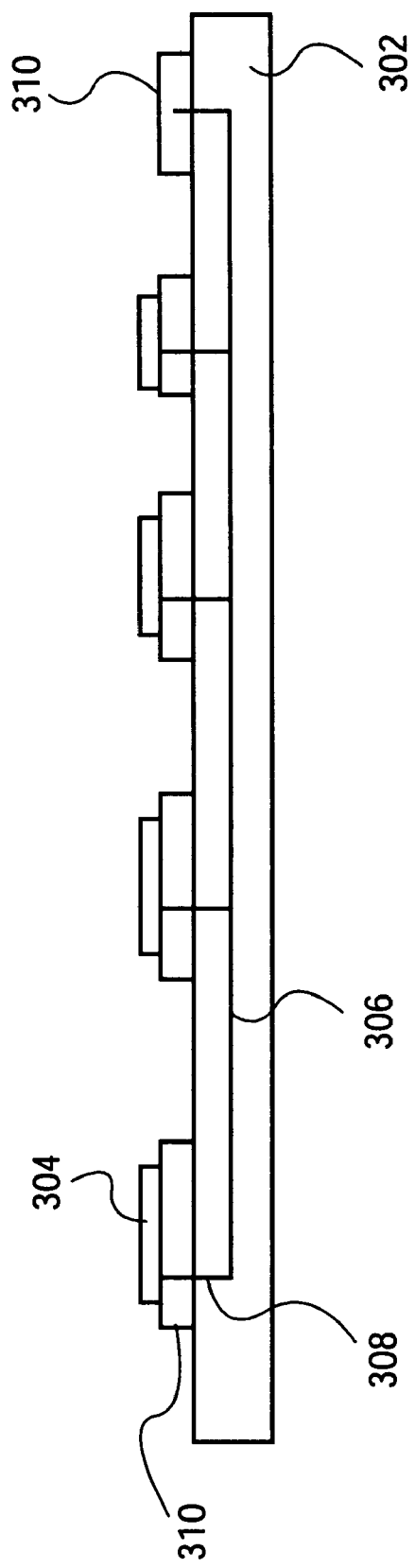
FIG. 3 provides an edge view of an embodiment of the present invention.

FIG. 3 provides an edge view of an embodiment of the present invention. Mounted on one side of motherboard (substrate) 302 are agents 304, such as, for example, microprocessors. These agents communicate via bus 306 and stubs 308 with chip set 310. For simplicity, only one trace for bus 306 is shown, and only one stub is shown for each agent. In practice, bus 306 will comprise several or more traces, and each agent may be connected to bus 306 via many stubs. (Bus 306 may not be visible from an edge view of an actual embodiment.) In the particular embodiment of FIG. 3, agents 304 are mounted on connectors 310 and are substantially colinear in their placement upon the motherboard. Agents 304 are mounted with their faces substantially parallel to the face of motherboard 302. In this way, stubs 308 are kept relatively small in length.

FIGS. 4a and 4b provide additional views of the embodiment of FIG. 3. FIG. 4a provides a top pictorial view of agent 406 comprising die 402 and package 404, where the arrow indicates the general bus direction with respect to the orientation of die 402 and package 404. As seen from FIG. 4a, the direction of the bus lines is substantially parallel to the edge of package 404. Also, die I/O pads 418 should be near the periphery of die 402 so that they are close to package pins 420 so as to shorten stub lengths and to allow an easier escape pattern.

FIG. 4b provides a plan view of vias 408 for agent 406 with respect to a direction perpendicular to motherboard 302. For simplicity, agent 406 is not shown in FIG. 4b, and only three stubs are explicitly shown. In practice, many or all of vias 408 may be connected to stubs. In the example of FIG. 4b, four bus traces or lines 410, 412, 414, and 416 are routed with respect to the via orientation as shown. In FIG. 4b, bus traces 410, 412, 414, and 416, and vias 408, may not necessarily lie in the same plane.

In general, for the embodiment of FIG. 4b and other embodiments, vias 408 define a regular array. The region between two consecutive rows (or columns) o a regular array of vias defines a channel. For the embodiment of FIG. 4b and other embodiments, bus lines are routed so as to be within or nderneath one and only one channel. That is, in an area or region of a board directly underneath an agent that is to be connected to a bus, individual us traces making up the bus do not cross from one channel to the next. For the particular embodiment shown in FIG. 4b, bus traces 410 and 412 are in one channel, and bus traces 414 and 416 are in another channel. Bus topologies such as those according to the embodiments of FIGS. 3, 4a, and 4b allow for relatively small stub lengths, and are found to address some or all of the problems cited in the Background.

For some applications, the length of the bus lines may introduce relatively large latencies. In such cases, for some embodiments, source synchronous communication may be employed, where the source (bus driver) sends both data and clock signals. In some embodiments, a quad pumped bus protocol may be used, where the ratio of the source synchronous clock rate to a common clock rate is equal to four, for example.

Figure 5A:
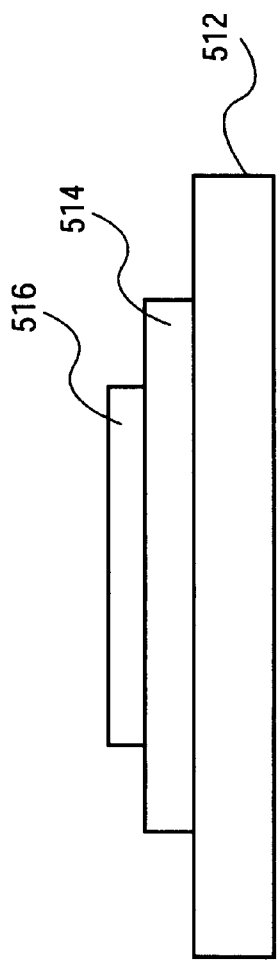
FIGS. 5a and 5b provide edge and top views, respectively, of an embodiment of the present invention having a "Y" topology.
Figure 5B:
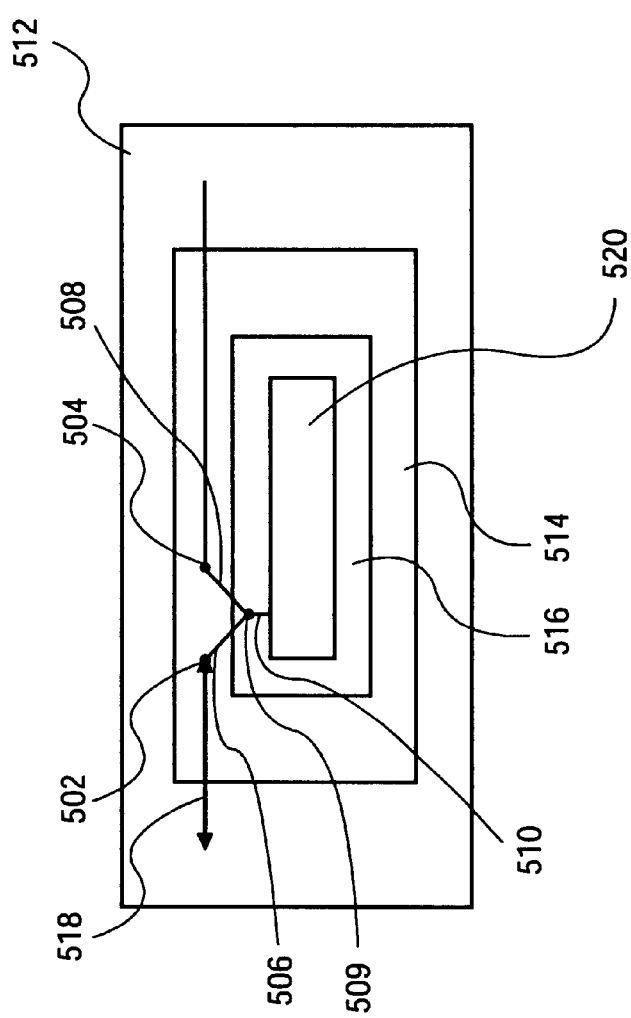

An embodiment for wide busses is illustrated in FIGS. 5a and 5b. FIG. 5a provides an edge view of a motherboard 512 having interconnector 514 mounted on it. Chip package 516 is mounted on interconnector 514. Interconnector 514 provides a connection between chip package 516 and bus traces (not shown in FIG. 5a) on motherboard 512, where the bus traces occupy a wider width than the dimension of chip package 516. A plan view from the top of chip package 516 is shown in FIG. 5a, where for simplicity only one bus trace 518 is shown. (Parts of bus trace 518 may not be visible in an actual embodiment.)

In FIG. 5b, bus trace 518 connects with interconnector 514 by way of vias 502 and 504. Bus trace 518 also extends on interconnector 514, shown in FIG. 5b, as portions 506 and 508. This extension of bus trace 518 on interconnector 514 connects with chip package 516 by way of via 509, and stub 510 provides the connection to die 520. In some embodiments, bus trace portions 506 and 508 may be linear, whereas in others they may be curved or non-linear, or any combination thereof. In one embodiment, the composition of interconnector 514 is such that the characteristic impedance of the portions 506 and 508 of bus trace 518 on interconnector 514 is substantially equal to the characteristic impedance of bus trace 518 on motherboard 512 so as to reduce signal reflection.

For the embodiment of FIGS. 5a and 5b, the stub lengths are relatively short due to the use of interconnector 514. This reduces signal degradation due to signal reflection. In the particular embodiment of FIGS. 5a and 5b, interconnector 514 is on the same side of motherboard 512 as chip package 516, so that interconnector 514 may be termed an interposer. However, in other embodiments, interconnector 514 may be on the opposite side of motherboard 512 relative to chip package 516, so that in these embodiments interconnector 514 may be termed an underposer.

Some busses comprise one or more traces and a conductive plane, so that a trace and the conductive plane comprise a structure for guided electromagnetic wave propagation, i.e., a transmission line. The characteristic impedance of a transmission line may be effected by discontinuities in the conductive plane and surrounding dielectric material.

Figure 6:
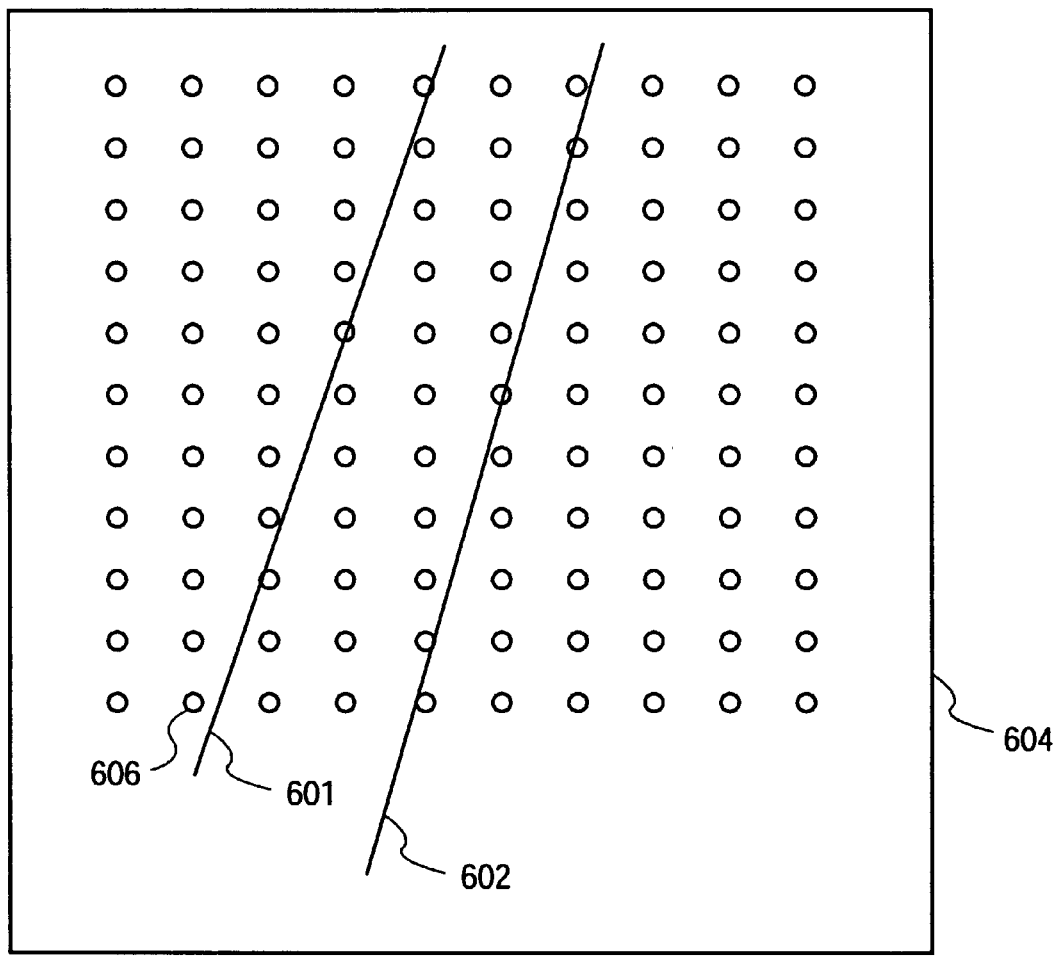
FIG. 6 provides a plan view of a bus trace positioned above a conductive plane with de-gassing holes according to an embodiment of the present invention.

In particular, de-gassing holes are introduced into a conductive plane to allow for gasses to escape, especially during manufacturing. These de-gassing holes present discontinuities in the conductive plane. Often, these de-gassing holes are aligned with each other to form a substantially regular array of holes, but this is not always necessarily the case. FIG. 6 provides a simplified plan view of bus traces 601 and 602 above conductive plane 604 having de-gassing holes 606.

In the embodiment of FIG. 6, bus traces 601 and 602 are aligned with respect to de-gassing holes 606 such that their characteristic impedances are substantially equal to each other. This may be accomplished by arranging traces 601 and 602 so that they have similar environments. For example, traces 601 and 602 may be routed so that each trace passes over the same local average of holes per unit length. This local average may be taken over a quarter-wavelength $\lambda/4$. Preferably, the sizing of de-gassing holes 606 are such that they are substantially smaller than the wavelength $\lambda$ of the electromagnetic wave to be propagated by traces 601 and 602. For example, the diameter of the degassing holes may be less than $\lambda/10$.

For the embodiment of FIG. 6, it is also preferable that variations in the characteristic impedance along the length of a trace are minimized. One approach is to route a trace so that the local average of holes per unit length passed by the trace is substantially independent of position along the trace.

Figure 7:
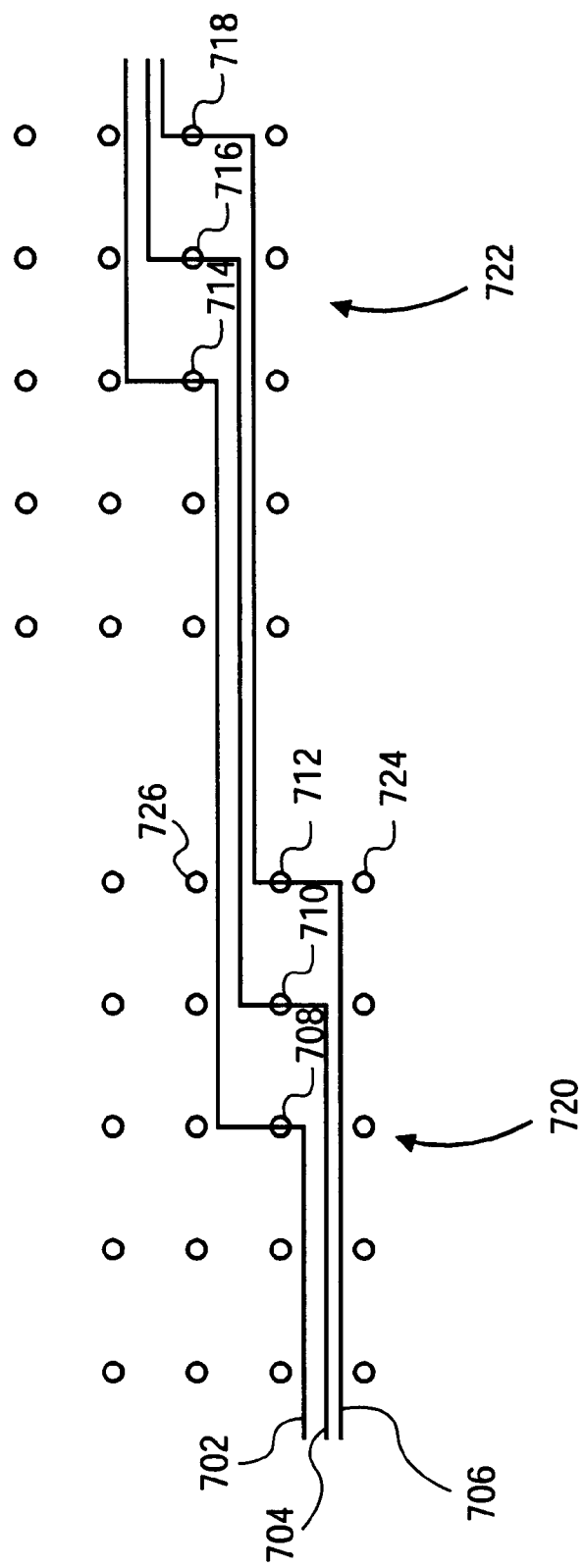
FIG. 7 provides a plan view of another embodiment of the present invention.

FIG. 7 illustrates another embodiment in which there are two pin fields, denoted by 720 and 722, for two agents (not shown). Three traces 702, 704, and 706 are routed on a circuit board (not shown) and are connected, respectively, to vias 708, 710, and 712 in pin field 720. In many prior art routing techniques, only two traces per channel are routed because each trace may easily connect with vias defining the channel, and thus the embodiment of FIG. 7 represents an improvement over such prior art routing techniques. Note that vias 708, 710, and 712 lie within one row of vias. Traces 702, 704, and 706 are also routed to second pin field 722 and connect with vias 714, 716, and 718, which also lie within one row of vias.

The row of vias containing via 724 and the row of vias containing via 712 define a first channel in pin field 720, and the row of vias containing via 712 and the row of vias containing via 726 define a second channel in pin field 720. As seen in FIG. 7, the traces enter one channel and exit an adjacent channel so that connections to the vias do not need to overlap the other traces. Routing multiple traces per channel reduces printed circuit board costs.

The embodiment of FIG. 7 may be extended to other embodiments with more than three traces in which vias within one row are to be connected to the traces. Furthermore, the connected vias need not be adjacent to one another. Also, there may be other layers in the circuit board in which other traces are deposited and routed so that traces enter one channel and exit and adjacent channel.

Various modifications may be made to the disclosed embodiments without departing from the scope of the invention as claimed below.

What is claimed is:

1. A circuit board comprising:

a conductive plane having de-gassing holes;

a first bus trace substantially parallel to the conductive plane;

a second bus trace substantially parallel to the conductive plane; and a dielectric disposed between the conductive plane and the first and second bus traces, the first bus trace with the conductive plane and dielectric providing a first transmission line and defining a first characteristic impedance to guide electromagnetic radiation having a first wavelength and the second bus trace with the conductive plane and dielectric providing a second transmission line and defining a second characteristic impedance to guide electromagnetic radiation having a second wavelength, wherein the de-gassing holes are substantial smaller than the first and second wavelengths, and wherein the first and second bus traces are positioned relative to the de-gassing holes so the first and second characteristic impedances are substantially equal to each other.

2. The circuit board as set forth in claim 1, wherein the de-gassing holes have diameters less than e-tenth of the minimum of the first and second wavelengths.

3. A circuit board comprising:

a conductive plane having de-gassing holes;

a first bus trace substantially parallel to the conductive plane;

a second bus trace substantially parallel to the conductive plane; and a dielectric disposed between the conductive plane and the first and second bus traces, the first bus trace with the conductive plane and dielectric to guide electromagnetic radiation having a first wavelength and the second bus trace with the conductive plane and dielectric to guide electromagnetic radiation having a second wavelength, wherein the de-gassing holes are substantially smaller than the first and second wavelengths, wherein the first bus trace passes over a first local average of the de-gassing holes per unit length, wherein the second bus trace passes over a second local average of the de-gassing holes per unit length, and wherein the first and second bus traces are positioned relative to the de-gassing holes so that the first and second local averages of the de-gassing holes per unit length are substantially equal to each other.

4. The circuit board as set forth in claim 3, wherein the second and first local averages are defined over one quarter of the largest of the first and second wavelengths.

5. The circuit board as set forth in claim 3, wherein the de-gassing holes have diameters less than one-tenth of the minimum of the first and second wavelengths.

* * * * *

UNITED STATES PATENT AND TRADEMARK OFFICE
CERTIFICATE OF CORRECTION

PATENT NO. : 6,624,717 B2
DATED : September 23, 2003
INVENTOR(S) : Dabral et al.

It is certified that error appears in the above-identified patent and that said Letters Patent is hereby corrected as shown below:

Column 2,
Line 45, after "(or columns)", delete "o", insert -- of --.
Line 48, delete "nderneath", insert -- underneath --.
Line 50, delete "us", insert -- bus --.

Signed and Sealed this

Twenty-third Day of December, 2003

JAMES E. ROGAN
*Director of the United States Patent and Trademark Office*